United States Patent
Leschkies et al.

(10) Patent No.: US 10,490,411 B2
(45) Date of Patent: Nov. 26, 2019

(54) METHOD FOR ENABLING SELF-ALIGNED LITHOGRAPHY ON METAL CONTACTS AND SELECTIVE DEPOSITION USING FREE-STANDING VERTICAL CARBON STRUCTURES

(71) Applicant: Applied Materials, Inc., Santa Clara, CA (US)

(72) Inventors: Kurtis Leschkies, San Jose, CA (US); Steven Verhaverbeke, San Francisco, CA (US); Ziqing Duan, Sunnyvale, CA (US); Abhijit Basu Mallick, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/599,920

(22) Filed: May 19, 2017

(65) Prior Publication Data

US 2018/0337061 A1    Nov. 22, 2018

(51) Int. Cl.
*H01L 21/306* (2006.01)
*H01L 21/32* (2006.01)

(52) U.S. Cl.
CPC ........ *H01L 21/30604* (2013.01); *H01L 21/32* (2013.01)

(58) Field of Classification Search
CPC .............. H01L 21/32; H01L 21/30604; H01L 21/76883; H01L 21/76897;
(Continued)

(56) References Cited

U.S. PATENT DOCUMENTS

| 9,512,541 B2 | 12/2016 | Shimizu et al. |
| 2010/0171093 A1 | 7/2010 | Kabir |

(Continued)

FOREIGN PATENT DOCUMENTS

| JP | 2010-062333 A | 3/2010 |
| KR | 10-2010-0100300 A | 9/2010 |

OTHER PUBLICATIONS

PCT Notification of Transmittal of the International Search Report and the Written Opinion of the International Searching Authority for Application No. PCT/US2018/028586; dated Aug. 9, 2018; 11 total pages.

*Primary Examiner* — Matthew L Reames
*Assistant Examiner* — Benjamin T Liu
(74) *Attorney, Agent, or Firm* — Patterson + Sheridan LLP (57) ABSTRACT

Embodiments described herein generally relate methods for selective deposition of carbon structures. In one embodiment, a method includes forming energized carbon species in a process chamber, diffusing the energized carbon species through a metal layer, wherein the metal layer is disposed on a first surface of a first material that is coplanar with a second surface of a second material, and forming a carbon structure between the first surface of the first material and the metal layer from the energized carbon species. Because the carbon structure is selectively deposited on the first surface and self-aligned to the first material, the possibility of overlay or misalignment of subsequent device layers formed on the first surface of the first material after the removal of the carbon structure is significantly reduced.

17 Claims, 7 Drawing Sheets

(58) Field of Classification Search
CPC ......... H01L 21/76829; H01L 21/02115; H01L 21/02274; H01L 21/02277; H01L 21/0337
See application file for complete search history.

(56) References Cited

U.S. PATENT DOCUMENTS

| | | |
|---|---|---|
| 2013/0001515 A1 | 1/2013 | Li et al. |
| 2013/0228933 A1 | 9/2013 | Narwankar et al. |
| 2013/0334704 A1 | 12/2013 | Berg et al. |
| 2014/0374960 A1* | 12/2014 | Cojocaru ............... C01B 32/184 |
| | | 264/430 |
| 2017/0194264 A1* | 7/2017 | Reber ............... H01L 21/76867 |

* cited by examiner

| 108 | | 108 |
| 116 | 114 | 116 | 114 |
| 104 | 106 | 104 | 106 |
| 102 | | | |

Fig. 2B

| | 114 | | 114 |
| 116 | | 116 | |
| 104 | 106 | 104 | 106 |
| 102 | | | |

Fig. 2C

| 116 | 120 ↓ | 116 | 120 ↓ |
| 104 | 106 | 104 | 106 |
| 102 | | | |

METHOD FOR ENABLING SELF-ALIGNED LITHOGRAPHY ON METAL CONTACTS AND SELECTIVE DEPOSITION USING FREE-STANDING VERTICAL CARBON STRUCTURES

BACKGROUND

Field

Embodiments described herein generally relate to the fabrication of integrated circuits (ICs), and more particularly, to methods for selective deposition of carbon structures.

Description of the Related Art

Reducing the size of ICs results in improved performance, increased capacity and/or reduced cost. Each size reduction requires more sophisticated techniques to form the ICs. Photolithography is commonly used to pattern ICs on a substrate. With the critical dimensions of advanced nodes of semiconductor devices and structures continuing to shrink, managing multiple mask passes per device layer and edge placement error (EPE) associated with multiple passes have become the biggest challenges to next generation lithography. Processes such as self-aligned double patterning (SADP), self-aligned quad patterning (SAQP), and litho-etch-litho-etch (LELE) may be used for extending the capabilities of photolithographic techniques beyond the minimum pitch capabilities of existing lithographic equipment. Following the SADP, SAQP, or LELE process, multi-cut or block masks are placed over the lines and spaces generated by SADP, SAQP, or LELE process to perform device patterning. As the feature size decreases, pitch and linewidth also decrease, causing the mask edge placement control to be more complicated and difficult.

Therefore, an improved method is needed.

SUMMARY

Embodiments described herein generally relate methods for selective deposition of carbon structures. In one embodiment, a method includes forming energized carbon species in a process chamber, diffusing the energized carbon species through a metal layer disposed over a substrate, wherein the metal layer is disposed on a first surface of a first material, and forming a carbon structure between the metal layer and the first surface of the first material from the energized carbon species.

In another embodiment, a method includes forming energized carbon species in a process chamber, diffusing the energized carbon species into a first material at a specific depth, wherein the first material is disposed over a substrate, and forming a carbon structure at the specific depth of the first material from the energized carbon species, wherein the carbon structure splits the first material into a first portion and a second portion.

In another embodiment, a method includes forming energized carbon species in a process chamber, diffusing the energized carbon species into a first material at a specific depth, wherein the first material is disposed over a substrate, forming a carbon structure at the specific depth of the first material from the energized carbon species, wherein the carbon structure splits the first material into a first portion and a second portion, wherein the carbon structure is disposed between the first portion and the second portion, and removing the carbon structure.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate methods for selective deposition of carbon structures. In one embodiment, a method includes forming energized carbon species in a process chamber, diffusing the energized carbon species through a metal layer, wherein the metal layer is disposed on a first surface of a first material that is coplanar with a second surface of a second material, and forming a carbon structure between the first surface of the first material and the metal layer from the energized carbon species. Because the carbon structure is selectively deposited on the first surface and self-aligned to the first material, the possibility of overlay or misalignment of subsequent device layers formed on the first surface of the first material after the removal of the carbon structure is significantly reduced.

Figure 1A:
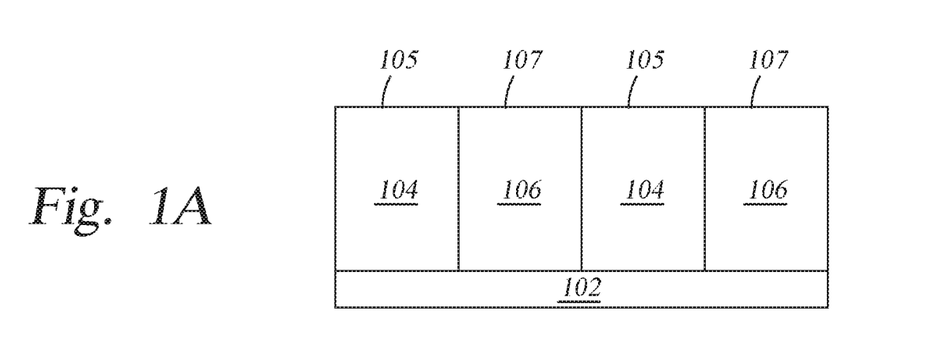
FIGS. 1A-1I illustrate a process for selective deposition of carbon structures according to embodiments described herein.

FIGS. 1A-1I illustrate a process for selective deposition of carbon structures according to embodiments described herein. As shown in FIG. 1A, a first material 104 and a second material 106 are disposed on a substrate 102. The substrate 102 may be any suitable substrate, such as a silicon substrate. The first material 104 is different from the second material 106. Each of the first material 104 has a first surface 105, and each of the second material 106 has a second surface 107. In one embodiment, the first material 104 is a dielectric material, and the second material 106 is a metal. The first surface 105 is a dielectric surface, and the second surface 107 is a metal surface. For example, the first material 104 may be silicon oxide, and the second material 106 may be copper or tungsten. The first surfaces 105 and the second surfaces 107 are coplanar. Although two first material 104 and two second material 106 are shown, there could be more or less numbers of first material 104 and second material 106 alternately disposed on the substrate 102. In some embodiments, the first material 104 and the second material 106 are disposed on and in contact with the substrate 102, as shown in FIG. 1A. In other embodiments, the first material 104 and the second material 106 are disposed over the substrate 102, and one or more layers may be disposed between the substrate 102 and the first material 104/second material 106. For example, the first material 104 and the second material 106 may be disposed on and in contact with a dielectric layer disposed over the substrate 102.

Figure 1B:
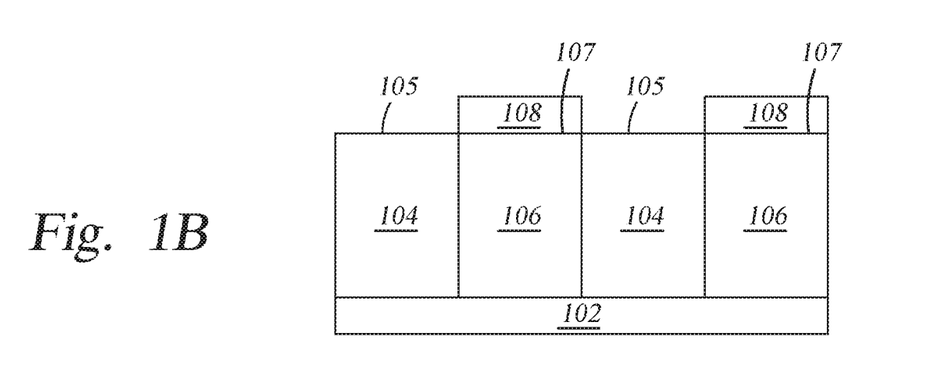

As shown in FIG. 1B, a metal layer 108 is formed on each of the second surfaces 107. The metal layers 108 are different from the second material 106. The metal layers 108 may be any suitable metal that allows energized carbon species to diffuse therethrough and catalyzes the formation of a carbon structure. The second material 106, in contrast, does not allow energized carbon species to diffuse therethrough and does not catalyze the formation of a carbon structure. In one embodiment, the metal layer 108 is a ferromagnetic metal, such as cobalt, nickel, or iron. In another embodiment, the metal layer 108 is a ferromagnetic metal alloy, such as any alloy of ferromagnetic metals.

Figure 1C:
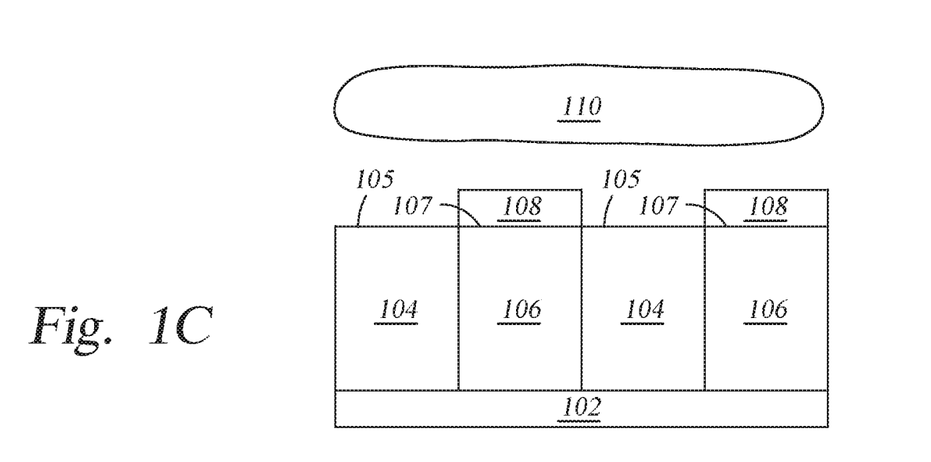

A plasma 110 is formed in a process chamber in which the substrate 102 is disposed, as shown in FIG. 1C. The plasma 110 includes one or more energized species. The plasma 110 may be formed by introducing one or more precursors into the process chamber and energizing the one or more precursors to form the plasma 110 containing energized species. In one embodiment, the one or more precursors include a carbon containing precursor such as acetylene ($C_2H_2$). In one embodiment, the one or more precursors include the carbon containing precursor and an etchant, such as ammonia ($NH_3$). The process chamber may have a pressure ranging from about 0.1 mTorr to about 100 Torr, and the substrate 102 may be maintained at a temperature less than 400 degrees Celsius, such as between about 300 degrees Celsius and about 390 degrees Celsius.

Figure 1D:
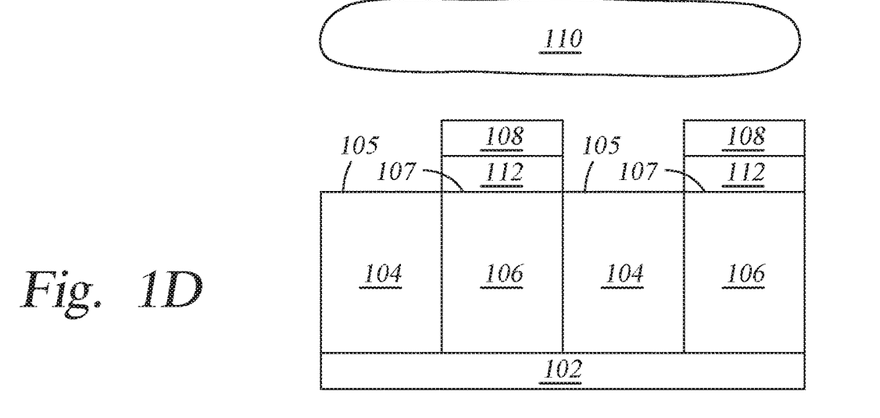

The energized species, such as energized carbon species, diffuse through the metal layers 108 and form a carbon layer 112 between each of the second material 106 and the metal layers 108, as shown in FIG. 1D. The formation of the carbon layer 112 is catalyzed by the metal layers 108. The carbon layer 112 may be formed on the second surfaces 107, and any carbon layer formed on the first surfaces 105 is removed by the etchant. The metal layers 108 are not etched by the etchant due to the etchant's selectivity over the carbon layer. Thus, the carbon layers 112 are formed on the second surfaces 107 but not on the first surfaces 105, and the carbon layers 112 are not etched by the etchant since the carbon layers 112 are protected by the metal layers 108. The carbon layers 112 may be formed, or deposited, at a rate of 1 micrometer per hour or higher.

Figure 1E:
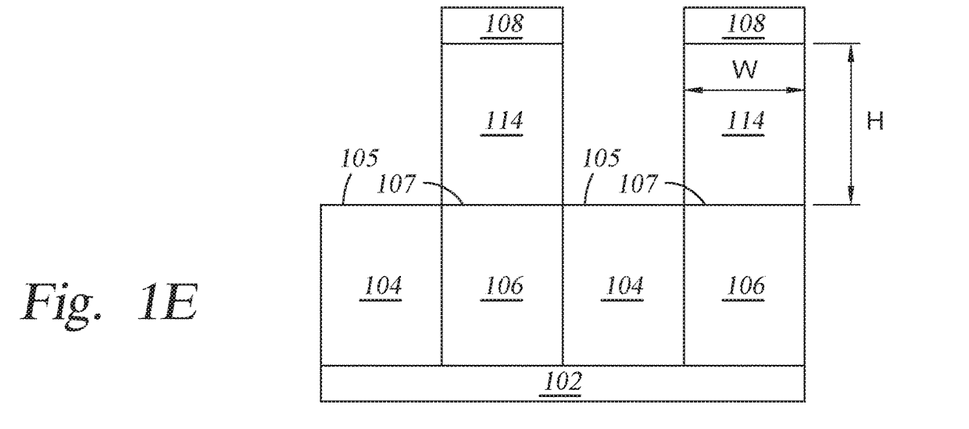

As the carbon layer 112 grows from the energized carbon species diffused through the metal layers 108, a carbon structure 114 is formed between each of the second material 106 and the metal layers 108, as shown in FIG. 1E. Each carbon structure 114 may have a height "H" ranging from about 100 nanometers to about 2 micrometers and a width "W" ranging from about 10 nanometers to about 70 nanometers. The width "W" matches the width of the second material 106. The carbon structures 114 may be pillar shaped, as shown in FIG. 1E. The carbon structures 114 are formed by a plasma enhanced chemical vapor deposition (PECVD) process, as shown in FIGS. 1C, 1D, and 1E. The benefits of using PECVD to form the carbon structures 114 include higher deposition rate, such as 1 micrometer per hour or higher, and the energized carbon can diffuse through the metal layers 108 so the carbon structures 114 are protected by the metal layers 108 from the etchant.

Figure 1F:
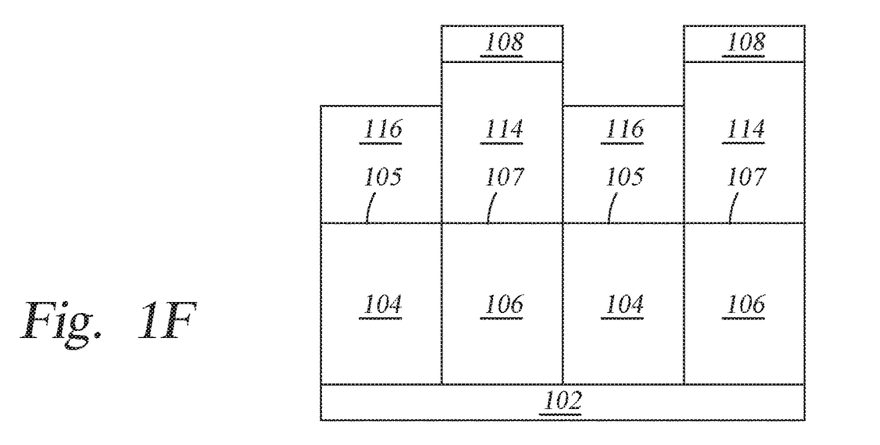

A dielectric material 116 is selectively deposited on each of the first surfaces 105 of the first material 104, as shown in FIG. 1F. The dielectric material 116 may be any suitable dielectric material, such as a nitride, for example, silicon nitride. The dielectric material 116 may be deposited by any suitable deposition process, such as chemical vapor deposition (CVD) process or PECVD process.

Figure 1G:
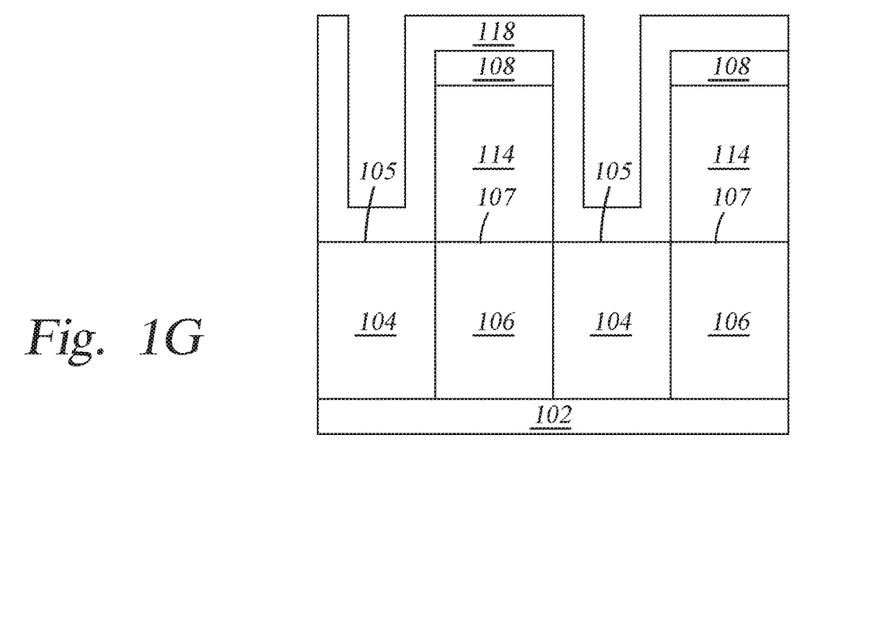

Alternatively, a dielectric material 118 is deposited on the first surfaces 105, the side walls of the carbon structures 114, and the metal layers 108, as shown in FIG. 1G. The dielectric material 118 may be the same as the dielectric material 116. The dielectric material 118 may be deposited by any suitable deposition process, such as atomic layer deposition (ALD) process.

Figure 1H:
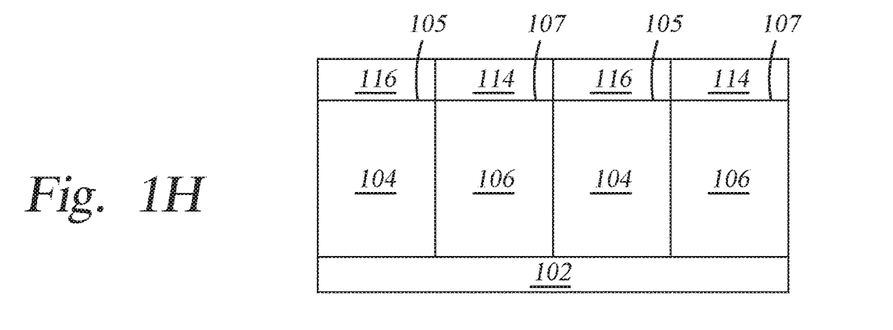
Figure 1I:
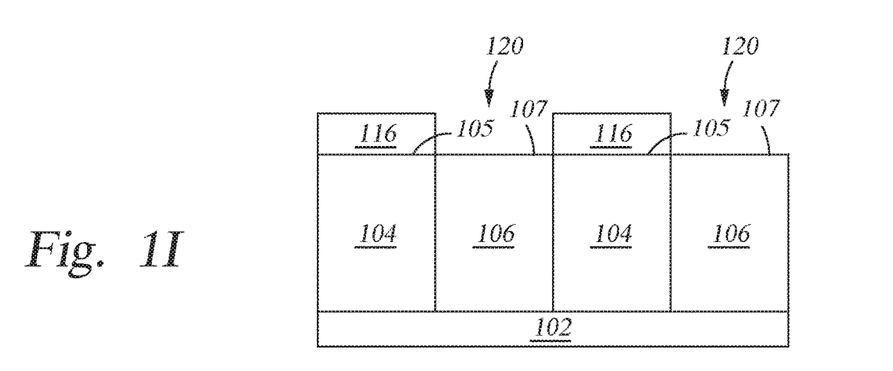

A chemical-mechanical polishing (CMP) process may be performed on the structure shown in FIG. 1F or in FIG. 1G to remove the metal layers 108 and to planarize the dielectric material 116 (or 118) and the carbon structures 114, as shown in FIG. 1H. The dielectric material 116 (or 118) and the carbon structures 114 are coplanar after the CMP process. Next, the carbon structures 114 are removed by any suitable removal method, such as dry etch or wet etch, as shown in FIG. 1I. The etchant used to remove the carbon structures 114 has an etch selectivity over the carbon structures 114 but does not etch the dielectric material 116 (or 118). In one embodiment, the etchant used to remove the carbon structures 114 is oxygen. As a result, openings 120 are formed and each opening 120 is between two dielectric material 116 (or 118). Any device layers formed in each opening 120 on the surface 107 of the second material 106 are self-aligned to the second material 106. The possibility of overlay or misalignment of the device layers to the second material 106 is significantly reduced.

Figure 2A:
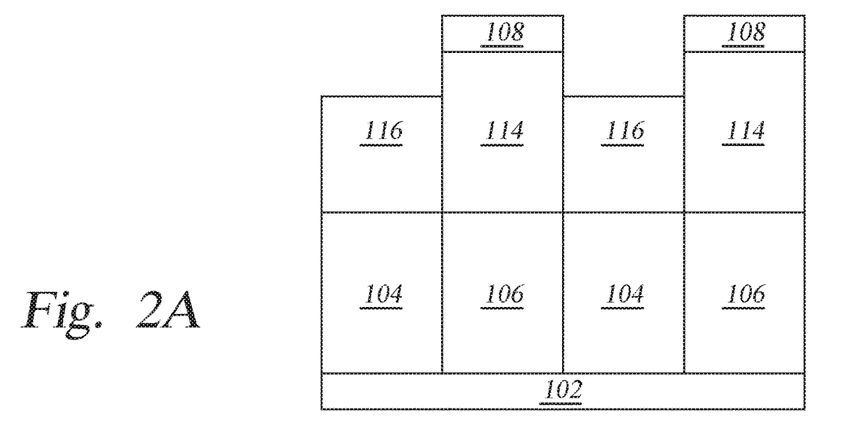
FIGS. 2A-2C illustrate a process for selective removal of carbon structures according to embodiments described herein.
Figure 2B:
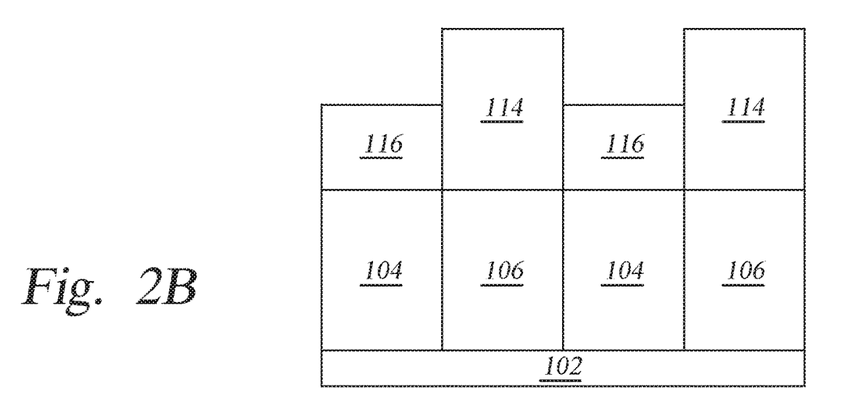

FIGS. 2A-2C illustrate a process for selective removal of carbon structures 114 according to embodiments described herein. FIG. 2A shows a structure that is identical to the structure shown in FIG. 1F. Instead of performing a CMP process to planarize the dielectric material 116 and the carbon structures 114 as shown in FIG. 1H, the metal layers 108 are first removed by either an etch process or a CMP process, as shown in FIG. 2B. In one embodiment, a dry etch process is performed to selectively remove the metal layers 108, and the etchant used has an etch selectivity over the metal layers 108 but does not etch the dielectric material 116 or the carbon structures 114. In one embodiment, the etchant is oxygen.

Figure 2C:
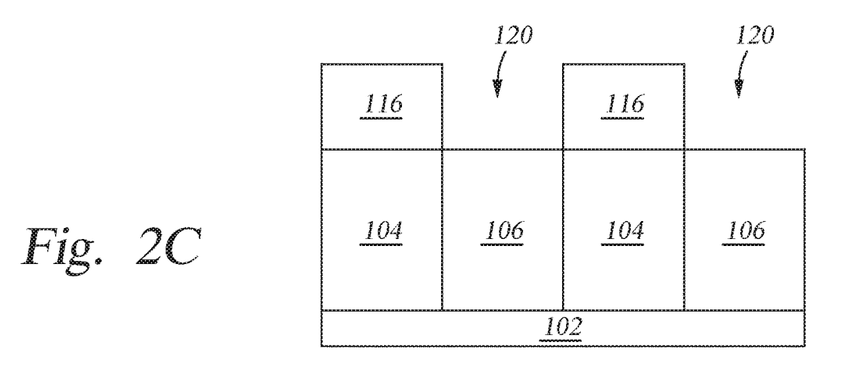

As shown in FIG. 2C, the carbon structures 114 are removed by any suitable removal process. In one embodiment, the carbon structures 114 are removed by a dry etch process. The etchant used to remove the carbon structures 114 has an etch selectivity over the carbon structures 114 but does not etch the dielectric material 116. In one embodiment, the etchant used to remove the carbon structures 114 is oxygen. As a result, openings 120 are formed and each opening 120 is between two dielectric material 116.

In some embodiments, the metal layers 108 and the carbon structures 114 are removed in a single process, such as a dry etch process. The etchant used to remove the metal layers 108 and the carbon structures 114 has an etch selectivity over the metal layers 108 and the carbon structures 114 but does not etch the dielectric material 116. In one embodiment, the etchant used to remove the metal layers 108 and the carbon structures 114 is a fluorine containing gas and oxygen.

Figure 3A:
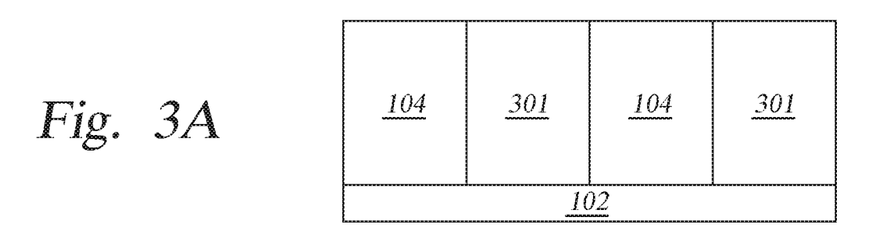
FIGS. 3A-3H illustrate a process for selective deposition of carbon structures according to embodiments described herein.

FIGS. 3A-3H illustrate a process for selective deposition of carbon structures according to embodiments described herein. As shown in FIG. 3A, the first material 104 and a second material 301 are disposed on the substrate 102. The first material 104 and the second material 301 may be coplanar, as shown in FIG. 3A. In one embodiment, the first material 104 is a dielectric material, and the second material 301 is a metal. The second material 301 may be the same material as the metal layer 108, which allows energized carbon species to diffuse thereinto and catalyzes the formation of a carbon structure. The second material 301 may be a ferromagnetic metal, such as cobalt, nickel, or iron, or a ferromagnetic metal alloy, such as any alloy of ferromagnetic metals. Although two first material 104 and two second material 301 are shown, there could be more or less numbers of first material 104 and second material 301 alternately disposed on the substrate 102. In some embodiments, the first material 104 and the second material 301 are disposed on and in contact with the substrate 102, as shown in FIG. 3A. In other embodiments, the first material 104 and the second material 301 are disposed over the substrate 102, and one or more layers may be disposed between the substrate 102 and the first material 104/second material 301. For example, the first material 104 and the second material 301 may be disposed on and in contact with a dielectric layer disposed over the substrate 102.

Figure 3B:
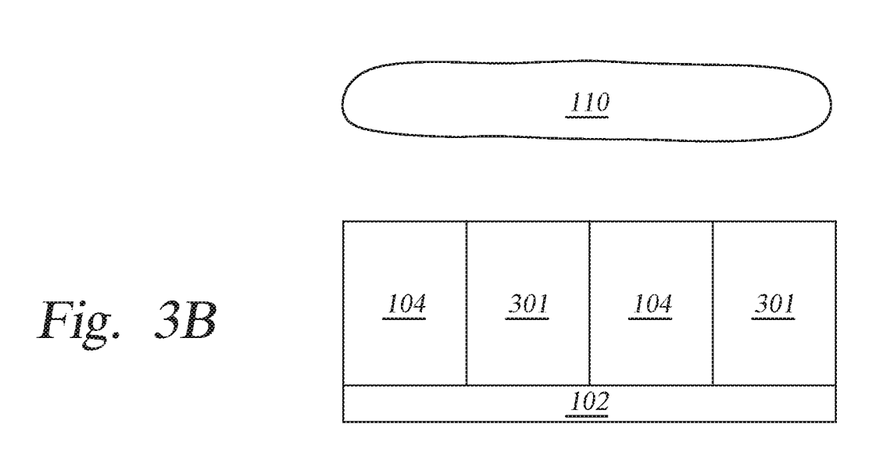

The plasma 110 is formed in a process chamber in which the substrate 102 is disposed, as shown in FIG. 3B. The plasma 110 includes one or more energized species. The plasma 110 may be formed by introducing one or more precursors into the process chamber and energizing the one or more precursors to form the plasma 110 containing energized species. In one embodiment, the one or more precursors include a carbon containing precursor such as acetylene ($C_2H_2$). In one embodiment, the one or more precursors include the carbon containing precursor and an etchant, such as ammonia ($NH_3$). The process chamber may have a pressure ranging from about 0.1 mTorr to about 100 Torr, and the substrate 102 may be maintained at a temperature less than 400 degrees Celsius, such as between about 300 degrees Celsius and about 390 degrees Celsius.

Figure 3C:
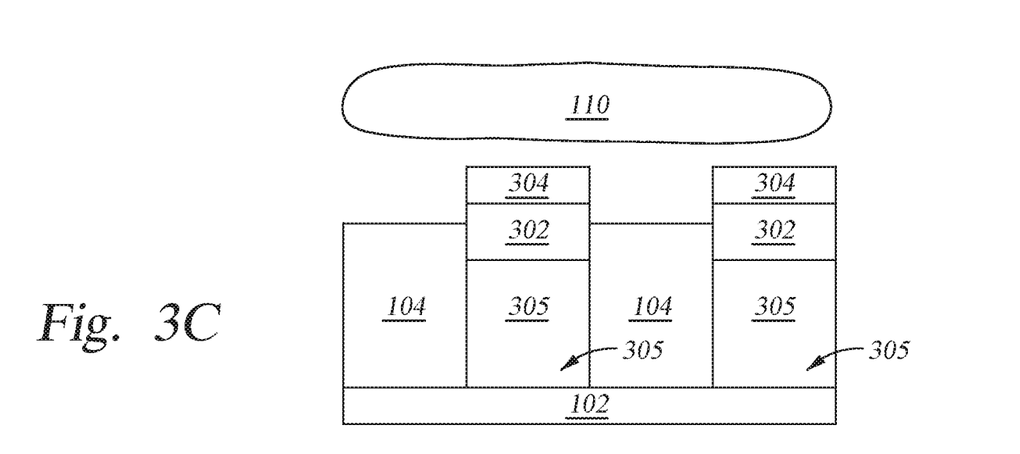

The energized species, such as energized carbon species, diffuse into the second material 301 at a specific depth, such as about 2 nanometers to about 10 nanometers. The energized carbon species form a carbon layer 302 at the specific depth of the second material 301, and the carbon layer 302 splits the second material 301 into a first portion 304 and a second portion 305 at the specific depth, as shown in FIG. 3C. The formation of the carbon layer 302 is catalyzed by the second material 301. Any carbon layer formed on the first material 104 is removed by the etchant. The second material 301 is not etched by the etchant due to the etchant's selectivity over the carbon layer. Thus, the carbon layers 302 are formed in the second material 301 but not on the first material 104, and the carbon layers 302 are not etched by the etchant since the carbon layers 302 are protected by the first portions 304 of the second material 301. The carbon layers 302 may be formed, or deposited, at a rate of 1 micrometer per hour or higher.

Figure 3D:
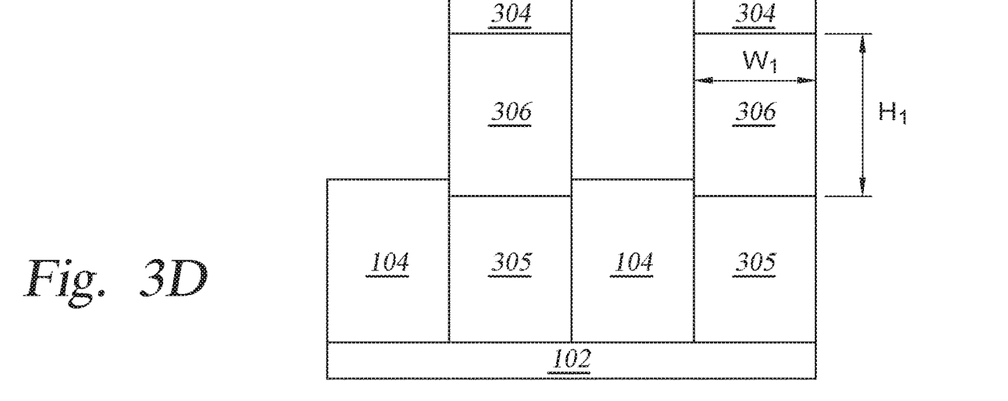

As the carbon layer 302 grows from the energized carbon species diffused into the second material 301, a carbon structure 306 is formed between each of the first portions 304 of the second material 301 and the second portions 305 of the second material 301, as shown in FIG. 3D. Each carbon structure 306 may have a height "H1" ranging from about 100 nanometers to about 2 micrometers and a width "W1" ranging from about 10 nanometers to about 70 nanometers. The width "W1" is equal to the width of the second portions 305. The carbon structures 306 may be pillar shaped, as shown in FIG. 3D. The carbon structures 306 are formed by a PECVD process, as shown in FIGS. 3B, 3C, and 3D. The benefits of using PECVD to form the carbon structures 306 include higher deposition rate, such as 1 micrometer per hour or higher, and the energized carbon species can diffuse into the second material 301 so the carbon structures 306 are protected by the first portions 304 of the second material 301 from the etchant.

Figure 3E:
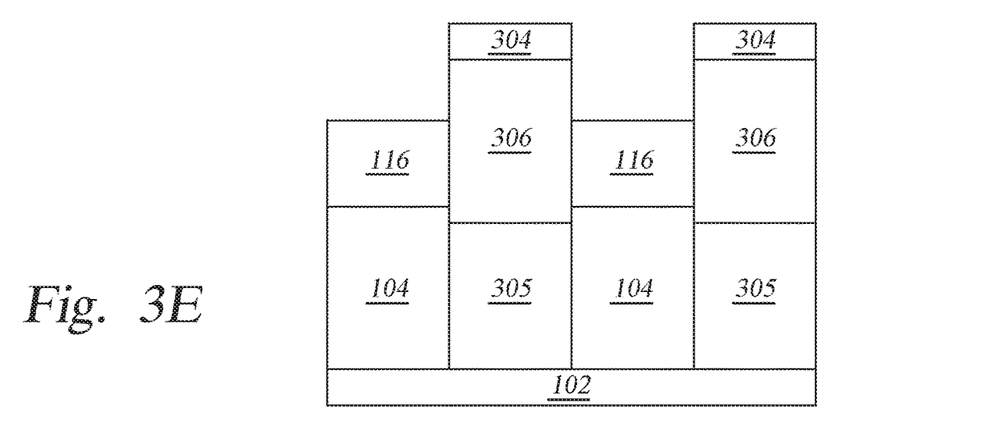

The dielectric material 116 may be selectively deposited on each of the first material 104, as shown in FIG. 3E. The dielectric material 116 may be any suitable dielectric material, such as a nitride, for example, silicon nitride. The dielectric material 116 may be deposited by any suitable deposition process, such as chemical vapor deposition (CVD) process or PECVD process.

Figure 3F:
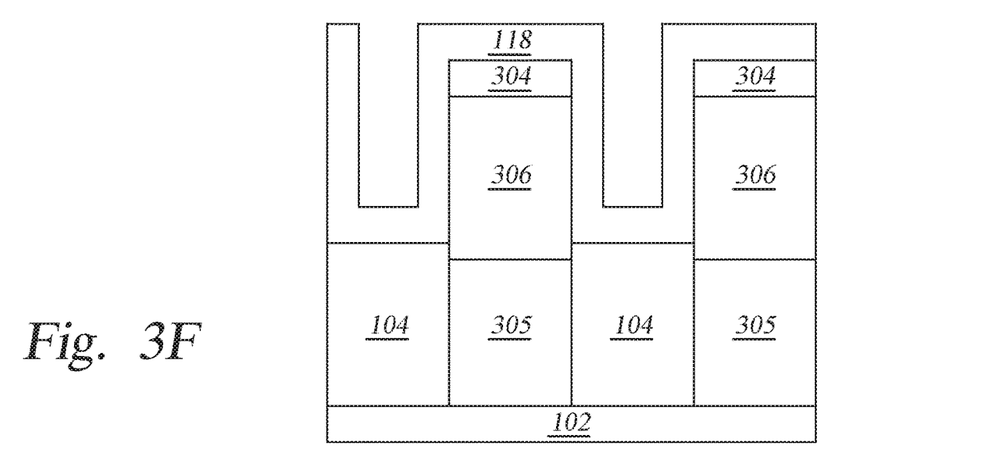

Alternatively, the dielectric material 118 is deposited on the first material 104, the side walls of the carbon structures 306, and the first portions 304 of the second material 301, as shown in FIG. 3F. The dielectric material 118 may be the same as the dielectric material 116. The dielectric material 118 may be deposited by any suitable deposition process, such as atomic layer deposition (ALD) process.

Figure 3G:
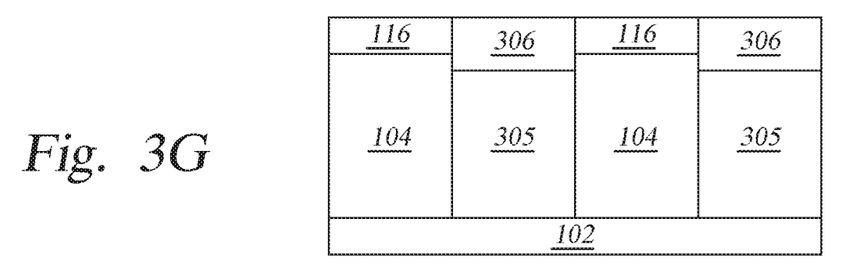
Figure 3H:
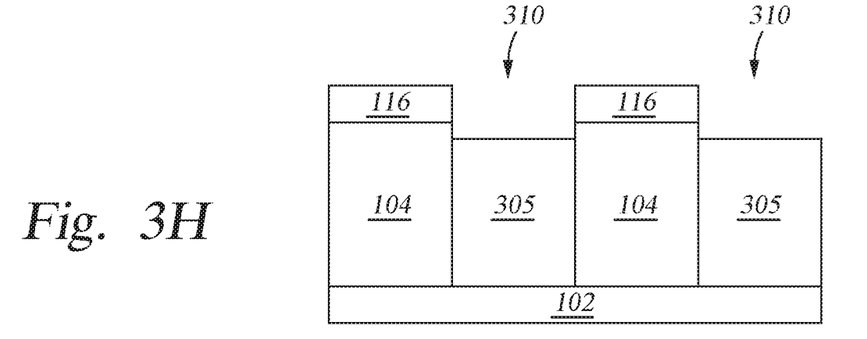

A chemical-mechanical polishing (CMP) process may be performed on the structure shown in FIG. 3E or in FIG. 3F to remove the first portions 304 of the second material 301 and to planarize the dielectric material 116 (or 118) and the carbon structures 306, as shown in FIG. 3G. The dielectric material 116 (or 118) and the carbon structures 306 are coplanar after the CMP process. Next, the carbon structures 306 are removed by any suitable removal method, such as dry etch or wet etch, as shown in FIG. 3H. The etchant used to remove the carbon structures 306 has an etch selectivity over the carbon structures 306 but does not etch the dielectric material 116 (or 118). In one embodiment, the etchant used to remove the carbon structures 306 is oxygen. As a result, openings 310 are formed and each opening 310 is between two dielectric material 116 (or 118). Any device layers formed in each opening 310 on the second portion 305 of the second material 301 are self-aligned to the second portion 305. The possibility of overlay or misalignment of the device layers to the second portion 305 is significantly reduced.

In some embodiments, a dry etch process or a wet etch process may be performed on the structure shown in FIG. 3E, and the first portions 304 of the second material 301 and the carbon structures 306 are removed by the dry or wet etch process to form the structure shown in FIG. 3H. The first portions 304 of the second material 301 and the carbon structures 306 are removed in a single process, such as a dry etch process. The etchant used to remove the first portions 304 of the second material 301 and the carbon structures 306 has an etch selectivity over the second material 301 and the carbon structures 306 but does not etch the dielectric material 116. In one embodiment, the etchant used to remove the first portions 304 of the second material 301 and the carbon structures 306 is a fluorine containing gas and oxygen.

In summary, carbon structures are selectively formed on a first material using a PECVD process. The benefits of using PECVD to form the carbon structures include higher deposition rate, such as 1 micrometer per hour or higher, and the energized carbon species can diffuse into the first material so the carbon structures are protected by the first material from an etchant that is removing any carbon layer formed on a second material. Openings are formed after the removal of the carbon structures, and any device layers formed in the openings are self-aligned to the first material. The possibility of overlay or misalignment of the device layers to the first material is significantly reduced.

While the foregoing is directed to embodiments of the disclosure, other and further embodiments may be devised without departing from the basic scope thereof, and the scope thereof is determined by the claims that follow.

What is claimed is:
1. A method, comprising:
  forming energized carbon species in a process chamber;

diffusing the energized carbon species through a metal layer disposed over a substrate, wherein the metal layer is disposed on a first surface of a first material, wherein the metal layer comprises a ferromagnetic metal or a ferromagnetic metal alloy, and wherein the first material comprises copper or tungsten that is different from the metal layer;

forming a carbon structure between the metal layer and the first surface of the first material from the energized carbon species; and removing the metal layer and the carbon structure by one or more removal processes, wherein the first surface of the first material is exposed at an end of the one or more removal processes.

2. The method of claim 1, wherein the carbon structure is formed at a rate of 1 micrometer per hour or higher.

3. The method of claim 1, wherein the carbon structure has a height ranging from about 1 micrometer to about 2 micrometers.

4. The method of claim 1, further comprising removing a carbon layer formed on a second surface of a second material with an etchant when forming the carbon structure.

5. The method of claim 1, wherein the carbon structure has a width that equals a width of the first material.

6. A method, comprising:
forming energized carbon species in a process chamber;
diffusing the energized carbon species into a first material at a specific depth, wherein the first material is disposed over a substrate;
forming a carbon structure at the specific depth of the first material from the energized carbon species, wherein the carbon structure splits the first material into a first portion and a second portion, wherein the carbon structure is disposed on the second portion of the first material, and the first portion of the first material is disposed on the carbon structure; and
removing the first portion of the first material and the carbon structure by one or more removal processes, wherein the second portion of the first material is exposed at an end of the one or more removal processes.

7. The method of claim 6, wherein the first material comprises a ferromagnetic metal or a ferromagnetic metal alloy.

8. The method of claim 6, wherein the specific depth ranges from about 2 nanometers to about 10 nanometers.

9. The method of claim 6, wherein the carbon structure is formed at a rate of 1 micrometer per hour or higher.

10. The method of claim 6, wherein the carbon structure has a height ranging from about 1 micrometer to about 2 micrometers.

11. The method of claim 6, wherein the carbon structure has a width that equals a width of the first material.

12. A method, comprising:
forming energized carbon species in a process chamber;
diffusing the energized carbon species into a first material at a specific depth, wherein the first material is disposed over a substrate;
forming a carbon structure at the specific depth of the first material from the energized carbon species, wherein the carbon structure splits the first material into a first portion and a second portion, wherein the carbon structure is disposed between the first portion and the second portion; and
removing the carbon structure by a removal process, wherein the second portion is exposed at an end of the removal process.

13. The method of claim 12, further comprising depositing a dielectric material on a second material disposed adjacent to the first material after forming the carbon structure and before removing the carbon structure, wherein the first material and the second material are coplanar.

14. The method of claim 13, wherein the dielectric material is deposited over the carbon structure.

15. The method of claim 13, further comprising removing the first portion of the first material after depositing the dielectric material and before removing the carbon structure.

16. The method of claim 13, further comprising removing the first portion of the first material, wherein the first portion of the first material is removed by the removal process.

17. The method of claim 12, wherein the carbon structure has a width that equals a width of the first material.

* * * * *